US012392564B2

(12) United States Patent
Cheng

(10) Patent No.: US 12,392,564 B2
(45) Date of Patent: Aug. 19, 2025

(54) MULTI-CHANNEL THIN HEAT EXCHANGER AND MANUFACTURING METHOD OF THE SAME

(71) Applicant: COOLER MASTER CO., LTD., Taipei (TW)

(72) Inventor: Jen-Chih Cheng, New Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 0 days.

(21) Appl. No.: 18/324,531

(22) Filed: May 26, 2023

(65) Prior Publication Data

US 2023/0296333 A1    Sep. 21, 2023

Related U.S. Application Data

(62) Division of application No. 17/154,923, filed on Jan. 21, 2021, now Pat. No. 11,703,287.

(60) Provisional application No. 62/964,131, filed on Jan. 22, 2020.

(51) Int. Cl.
*F28F 3/12*    (2006.01)
*H05K 7/20*    (2006.01)
*F28F 3/14*    (2006.01)

(52) U.S. Cl.
CPC ........... *F28F 3/12* (2013.01); *H05K 7/20309* (2013.01); *H05K 7/20318* (2013.01); *F28F 3/14* (2013.01)

(58) Field of Classification Search
CPC ..... F28F 3/12; F28F 3/14; H05K 7/20; H05K 7/20309; H05K 7/20318; F28D 15/043; F28D 15/0233; F28D 15/0283; F28D 15/04; F28D 15/0266; F28D 15/0275; H01L 23/427
See application file for complete search history.

(56) References Cited

U.S. PATENT DOCUMENTS

| 5,697,428 A | 12/1997 | Akachi |
| 2013/0133871 A1 | 5/2013 | Ma et al. |
| 2015/0323261 A1 | 11/2015 | Tseng |
| 2018/0266738 A1 | 9/2018 | Li et al. |
| 2021/0131741 A1* | 5/2021 | Tseng .................... F28D 15/025 |

FOREIGN PATENT DOCUMENTS

| CN | 101936676 A | 1/2011 |
| CN | 102062552 A | 5/2011 |
| CN | 204169432 U | 2/2015 |
| CN | 104422319 B | 8/2016 |
| EP | 3336471 A1 | 6/2018 |

* cited by examiner

*Primary Examiner* — Harry E Arant
(74) *Attorney, Agent, or Firm* — Merchant & Gould P.C.

(57) ABSTRACT

A heat dissipation device includes a body including a first metal sheet and a second metal sheet coupled to the first metal sheet. The first metal sheet at least partially defines a first channel including a first plurality of curves, a second channel including a second plurality of curves, and an interconnecting channel fluidly coupled to the first channel and the second channel. The first channel and the interconnecting channel at least partially surround the second channel, a unit volume of the first channel is a same as a unit volume of the interconnecting channel, and the unit volumes of the first channel and the interconnecting channel are different from a unit volume of the second channel.

6 Claims, 16 Drawing Sheets

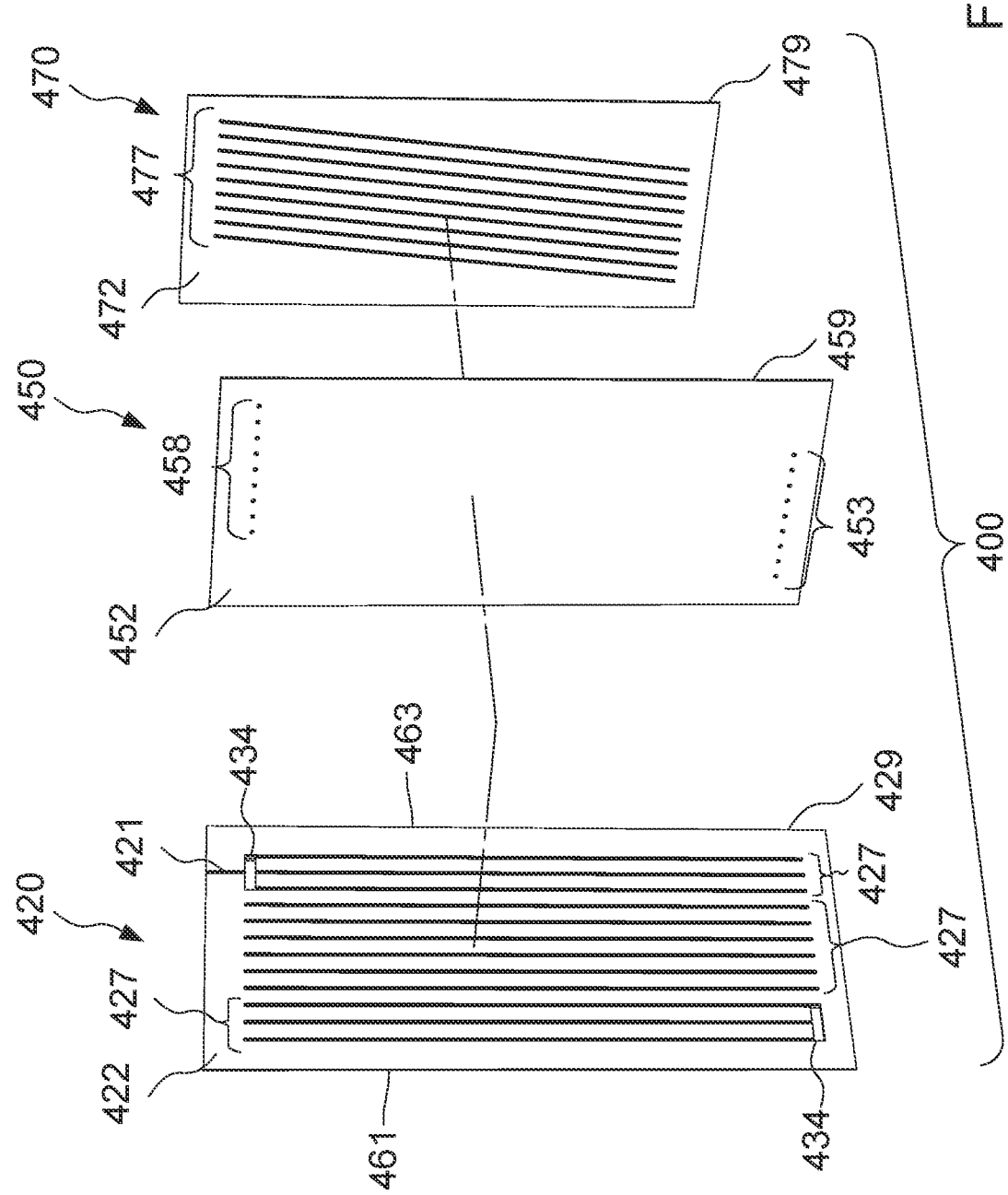

MULTI-CHANNEL THIN HEAT EXCHANGER AND MANUFACTURING METHOD OF THE SAME

CROSS-REFERENCE TO RELATED APPLICATIONS

This divisional application claims priority under 35 U.S.C. § 120 to non-provisional application Ser. No. 17/154, 923, filed Jan. 21, 2021, which claims priority under 35 U.S.C. § 119 to U.S. Provisional Application No. 62/964, 131, filed Jan. 22, 2020. The entire contents of both these applications are hereby incorporated by reference.

TECHNICAL FIELD

Embodiments of the disclosure relate generally to heat transfer mechanisms and, more particularly, to multi-channel thin heat exchangers and manufacturing methods of the same.

BACKGROUND

During operation of electronic devices, the heat generated by the devices must be dissipated quickly and efficiently to keep operating temperature within manufacturer recommended ranges, under, at times, challenging operating conditions. As these electronic devices increase in functionality, the power requirements of the electronic devices also increases, which increases the heat generated by the electronic devices and, in turn, increases the cooling requirements.

Several techniques have been developed for dissipating heat from electronic devices. One such technique is an air-cooling system, wherein a heat exchanger is in thermal contact with the electronic devices for conducting heat away from the electronic devices, and then flowing air over the heat exchanger to remove heat.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5C is an exploded view of the multi-channel thin heat exchanger of FIG. 5A, according to embodiments of the disclosure.

DETAILED DESCRIPTION

Existing heat exchangers include a multi-channel heat exchanger that has a plurality of channels, at least some of which are configured as capillaries. The heat exchanger may be a closed-looped system or open-looped system. In a closed-looped system, multi-channel heat exchangers are vacuum containers that carry heat from a heat source by evaporation of a working fluid which flows due to a vapor flow in the vacuum. The vapor flow condenses over cooler surfaces, and, as a result, the heat is transported from an evaporation surface that is thermally coupled to the heat source to a condensation surface for dissipating heat. Pressure differences inside the multi-channel heat exchanger due to the heat input at the heat source end and heat output at the cooling surface end cause a flow imbalance inside the multi-channel heat exchanger. Because of the flow imbalance, condensed fluid flows back to the evaporation surface portion of the multi-channel heat exchanger.

The thermal performance of multi-channel heat exchangers is dependent on the effectiveness of the heat exchangers to dissipate heat via the phase change liquid-vapor-liquid mechanism through the multi-channels. The desired thermal performance is dependent on the construction of the heat exchanger. A simpler more consistent manufacturing process can result in heat exchangers having the desired performance. Another aspect to achieving the desired thermal performance is the effectiveness of the manufacturing method to close and seal the heat exchangers to minimize leakage that causes loss of working fluid and dry-out, without increasing complexity of the manufacturing method. Yet another aspect to achieving the desired thermal performance is the effectiveness of the manufacturing method to improve fluid and vapor flow inside the heat exchanger without increasing complexity of the manufacturing method.

Embodiments of the disclosure describe various principles related to heat exchanger systems and methods by way of reference to specific examples of heat exchanger systems and methods, including specific arrangements and examples of metal sheets, channels and bends (curves, bends) embodying inventive concepts. However, embodiments are not limited to any particular heat exchanger or any particular heat dissipation device. Embodiments of the disclosure are equally applicable to other heat exchangers and heat dissipation devices, without departing from the scope of the disclosure.

Figure 1A:
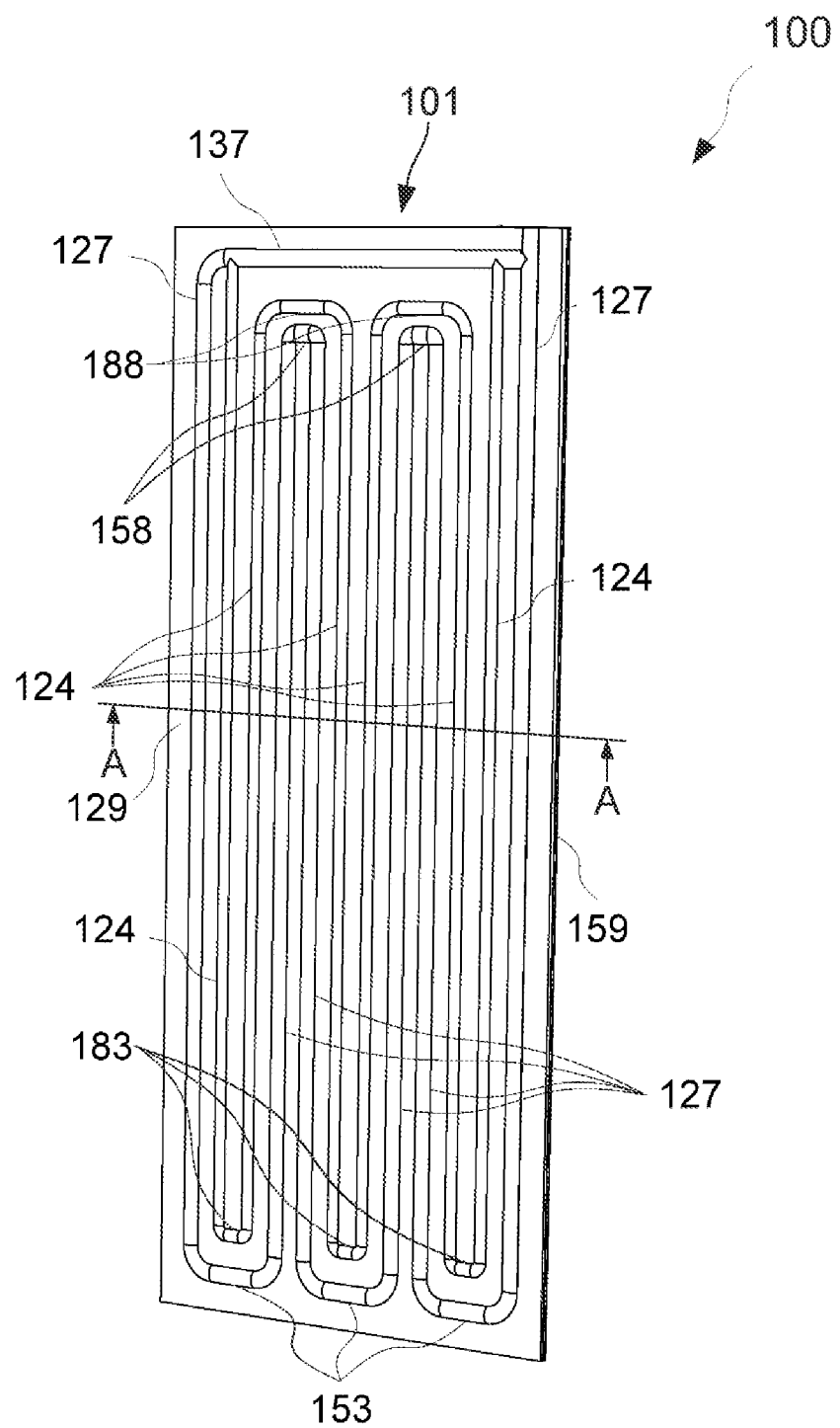
FIG. 1A is a perspective view of a multi-channel thin heat exchanger, according to embodiments of the disclosure.
Figure 1B:
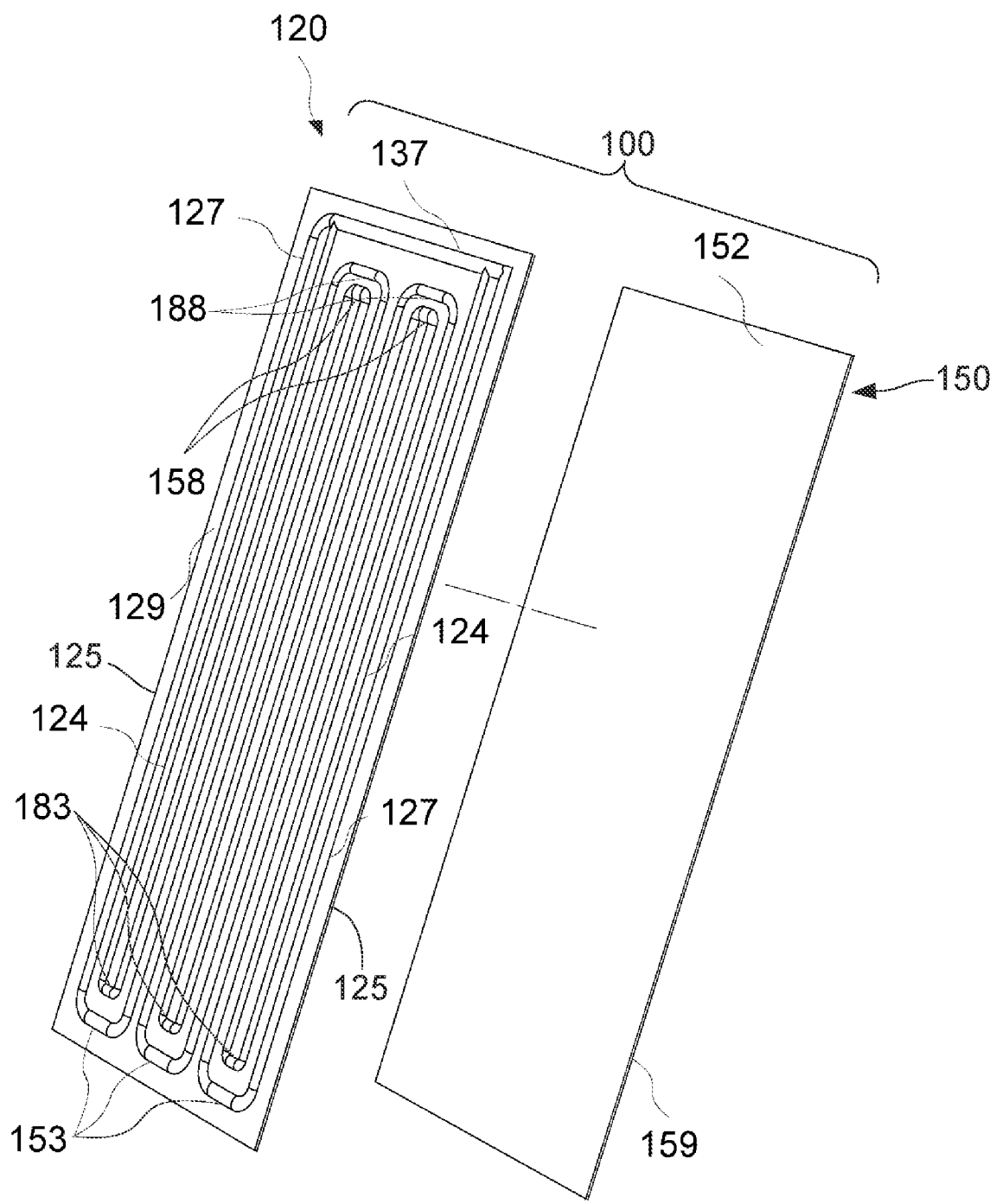
FIG. 1B is an exploded view of the multi-channel thin heat exchanger of FIG. 1A, according to embodiments of the disclosure.
Figure 1C:
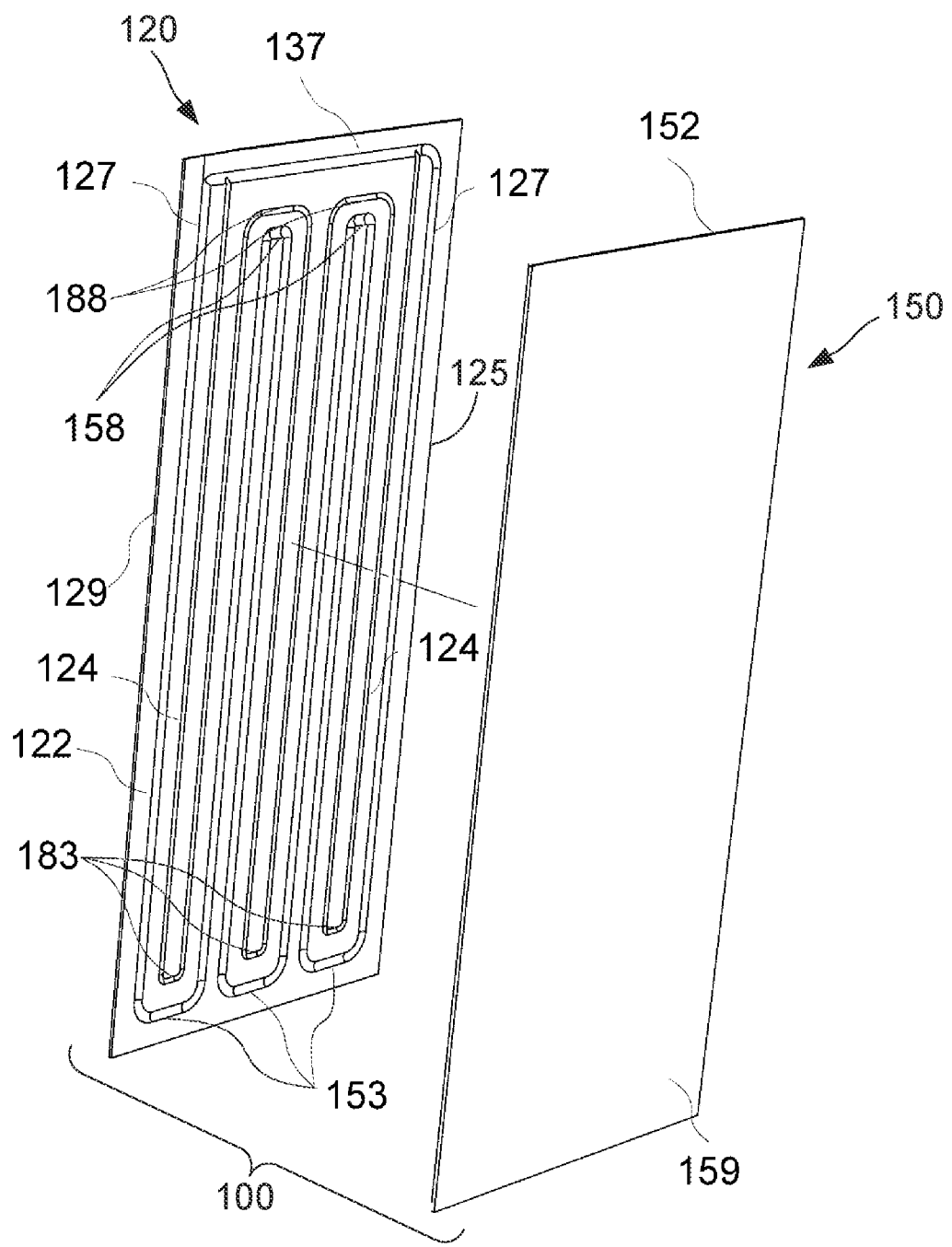
FIG. 1C is another exploded view of the multi-channel thin heat exchanger of FIG. 1A, according to embodiments of the disclosure.

FIG. 1A is a perspective view of a multi-channel thin heat exchanger 100, according to embodiments of the disclosure. FIG. 1B is an exploded view of the multi-channel thin heat exchanger 100 of FIG. 1A, according to embodiments of the disclosure. FIG. 1C is another exploded view of the multi-channel thin heat exchanger 100 of FIG. 1A, according to embodiments of the disclosure. Referring to FIGS. 1A to 1C, the multi-channel thin heat exchanger 100 includes a body 101 having a first metal sheet 150 and a second metal sheet 120. The first metal sheet 150 includes a first inner surface 152 and a first outer surface 159. The second metal sheet 120 includes a second inner surface 122 and a second outer surface 129. The first inner surface 152 and the second inner surface 122 contact each other when the first metal sheet 150 and the second metal sheet 120 contact each other. The second inner surface 122 includes (or at least partially defines) an interconnecting channel 137, a first channel 127 having a plurality of first bends (or curves) 153, 158, and a second channel 124 having a plurality of second bends 183, 188. Each of the first channel 127 and the second channel 124 is a continuous structure that extends along the second inner surface 122 in a serpentine shape that is formed by the respective plurality of first bends 153, 158, and plurality of second bends 183, 188. Each channel 127, 124 and 137 is formed as a recess in the second inner surface 122. Alternatively, each channel 127, 124 and 137 is formed as a corresponding protrusion on the second outer surface 129.

In some embodiments, the interconnecting channel 137 is in fluid communication with the first channel 127 and the second channel 124. The first channel 127 is formed at or adjacent the outer edges 125 of the second inner surface 122 and the second channel 124 is formed between portions of the first channel 127. As illustrated, the first channel 127 and the second channel 124 form an interleaved structure and the first channel 127 at least partially surrounds the second channel.

The number of first bends 153, 158, and second bends 183, 188 is not limited in any regard. The number of first bends 153, 158, and second bends 183, 188 can be increased or decreased to increase or decrease the lengths of the corresponding first channel 127 and the second channel 124 as required by application and design, without departing from the scope of the disclosure.

Figure 2:
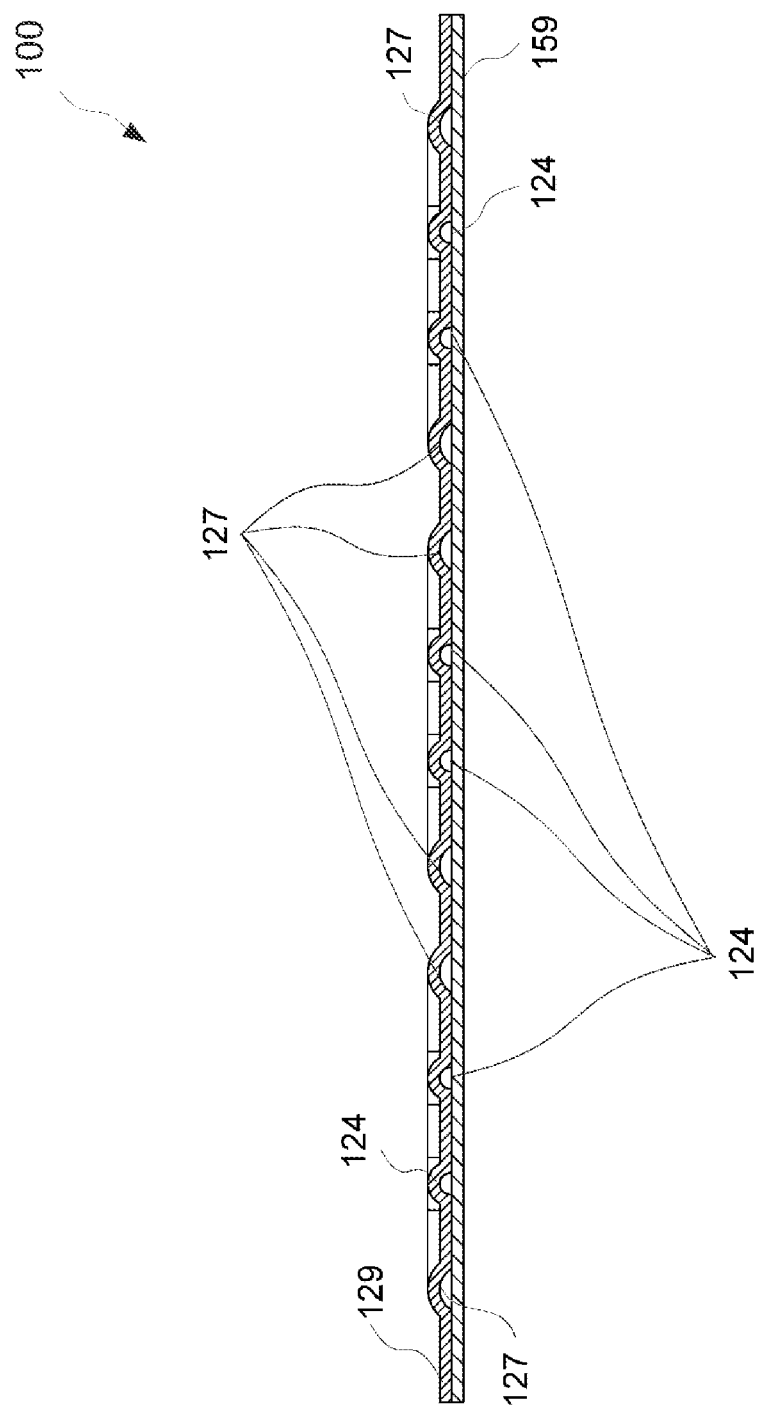
FIG. 2 is a cross-sectional view of the multi-channel thin heat exchanger of FIG. 1A along line A-A, according to embodiments of the disclosure.

FIG. 2 is a cross-sectional view of the multi-channel thin heat exchanger 100 of FIG. 1A along line A-A, according to embodiments of the disclosure. Referring to FIG. 2, with continued reference to FIGS. 1A to 1C, the first channel 127 having the plurality of first bends 153, 158 and the second channel 124 having the plurality of second bends 183, 188 have a serpentine shape and are formed tracking one another. In other words, the first channel 127 and the second channel 124 are arranged in a non-intersecting pattern.

In some embodiments, heights (or, alternatively, depths) of the interconnecting channel 137, the first channel 127, and the second channel 124 are the same. For the purposes of discussion herein, the height is considered as measured from the second outer surface 129. Alternatively, the depth is considered as measured from the second inner surface 122. The widths of the interconnecting channel 137 and the first channel 127 are the same. The width of the second channel 124 is smaller than the width of the interconnecting channel 137 and the first channel 127. For the purposes of discussion herein, the width is measured along (parallel to) the second inner surface 122 (or the second outer surface 129). The widths and the heights (or depths) of each of the first channel 127, the second channel 124, and the interconnecting channel 137 are the same the entire extent of the channels.

Thus, due to the difference in the widths, unit volumes of the first channel 127 and the interconnecting channel 137 are the same, and the unit volumes of the first channel 127 and the interconnecting channel 137 are different from a unit volume of the second channel 124. As used herein, 'unit volume', and variations thereof, refer to the volume of a channel for a unit length of the channel. In other words, the circumference (or girth) of the first channel 127 and the interconnecting channel 137 are the same, and circumference (or girth) of the first channel 127 and the interconnecting channel 137 are different than the circumference (or girth) of the second channel.

The difference in width of the first channel 127 and the second channel 124 increases the surface area for heat dissipation between the first and second channels and bends. The difference in widths creates a non-equilibrium pressure condition in the channels.

It will be understood that the height and width can be varied as required by application and design requirements, without departing from the scope of the disclosure.

In some embodiments, the multi-channel thin heat exchanger includes a working fluid in the channels. The working fluid flows in the form of liquid vapor slugs/bubbles in the first and second multi-channels and bends. The multi-channel thin heat exchanger includes an evaporator region, a condenser region, and vapor flow channel regions extending from the evaporator region to the condenser region. When heat from a heat source (e.g., electronic device thermally coupled to the heat exchanger) is applied to the evaporator region, the heat converts the working fluid to vapor and the vapor bubbles increase in size and number in the multi-channel thin heat exchanger.

At the condenser region, heat is removed and the bubbles are reduced in size. The volume expansion due to vaporization and the contraction due to condensation cause an oscillating motion within the channels. The net effect of the temperature gradient between the evaporator region and the condenser region and the pressure difference in the first and second channels creates a non-equilibrium pressure condition. Thus, thermo-fluidic transport is provided via the self-sustaining oscillation driving forces and a generated pressure difference. The thermo-fluidic transport is improved by the different widths of the first and second channels and this increases output pressure gain in, for example, the second channels that have the relatively smaller width, increasing oscillation driving forces and thus improving thermal performance. Also, the different widths of the first and second channels allow for a greater surface area for heat dissipation and also allows for heat dissipation to occur in portions of the multi-channel thin heat exchanger 100 between the first and second channels.

In some embodiments, the first and second inner surfaces 152, 122 are bonded together at locations other than the locations including the interconnecting channel 137, the first channel 127, and the second channel 124. In some embodiments, the multi-channel thin heat exchanger 100 is manufactured by roll-bonding.

Figure 3:
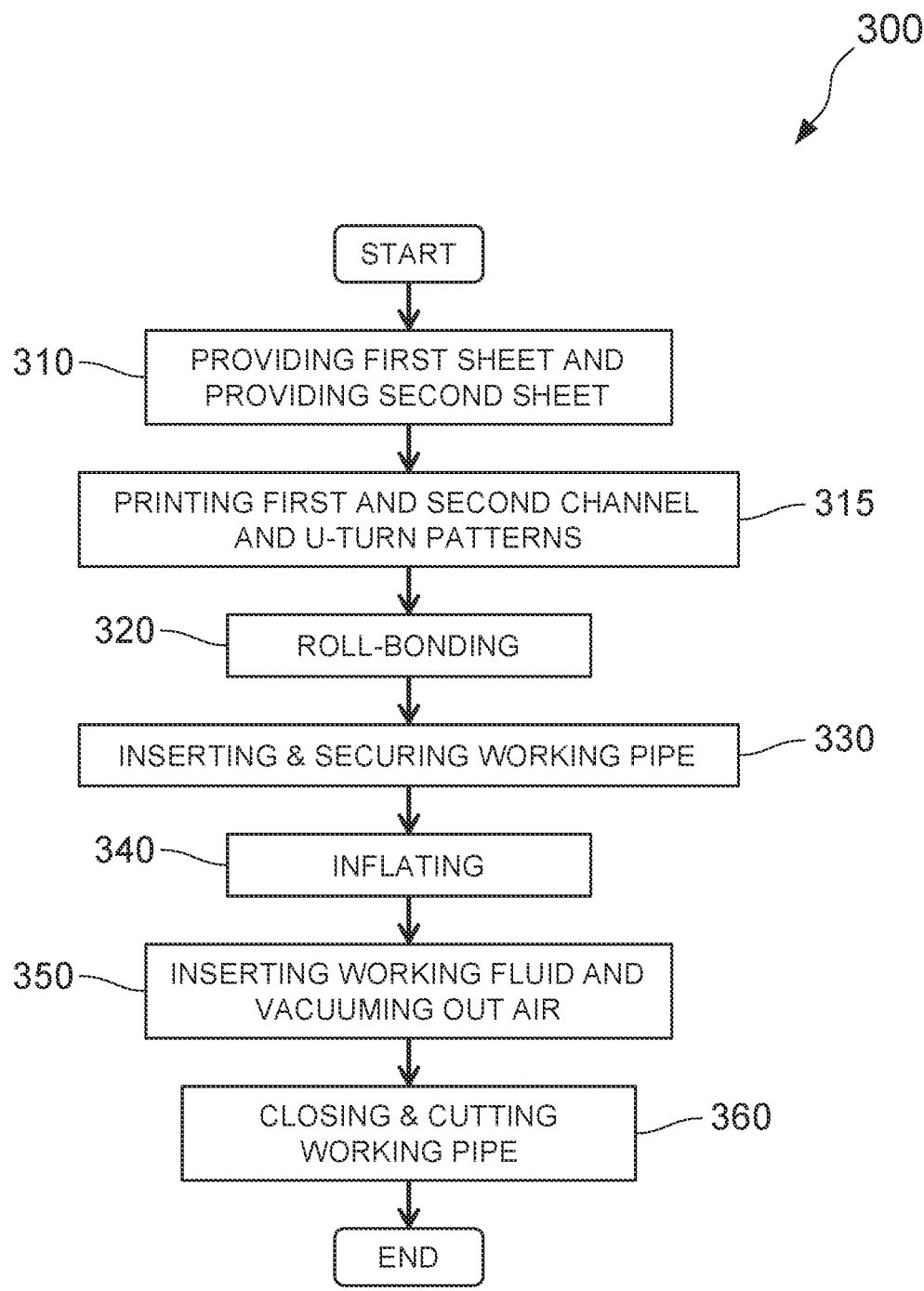
FIG. 3 is a flow chart illustrating a manufacturing method of the multichannel thin heat exchanger of FIG. 1A, according to embodiments of the disclosure.

FIG. 3 is a flow chart of a manufacturing method 300 of the multi-channel thin heat exchanger 100 of FIGS. 1A, according to embodiments of the disclosure. Referring to FIG. 3, and with continued reference to FIGS. 1A to 2B, the method 300 includes operation 310 of providing a first metal sheet and a second metal sheet. In some embodiments, the first and second metal sheets 150, 120 are metal coils, unrolled using an unwinder and then aligned by a suitable roller stand. Next, in operation 315, a pattern of the first and second channels and bends are printed on one of the metal sheets (e.g., second metal sheet 120). In some embodiments, the sheets are cleaned and then printed by a screen printing process employing a graphite pattern of the interconnecting channel 137, the first channel 127 having the first bends 153, 158 and the second channel 124 having the second bends 183, 188. In some embodiments, the multi-channel thin heat exchanger 100 further includes a working section 151 extending from the first channel 127 and near an adjacent outer edge of the second inner surface 122. The first channel 127 extends through the working section to an edge of the working section. In some embodiments, the screen printing process employing the graphite pattern also prints the first channel 127 extending through the working section 151. In some embodiments, the relatively flat, straight lined welded portions of the working section 151 provide an effective method to close and seal the multichannel thin heat exchanger to prevent leaks and improve strength of the multichannel thin heat exchanger. Thus, loss of working fluid is reduced and dry-out conditions are reduced.

In operation 320, the first inner surface of the first metal sheet and the second inner surface of the second metal sheet are integrally bonded in areas other than the areas including the interconnecting channel 137, the first channel 127, the bends 153, 158, the second channel 124, and the bends 183, 188. It should be understood that in areas including the interconnecting channel 137, the first channel 127, the bends 153, 158, the second channel 124, and the bends 183, 188, the first inner surface of the first metal sheet and the second inner surface of the second metal sheet can contact each other, but are not bonded (stuck) to each other. Keeping the inner surfaces separated, permits inflating the interconnecting channel 137, the first channel 127, and the second channel 124, as discussed below.

Those of ordinary skill in the relevant art may readily appreciate that graphite serves as a release agent and prevents the first and second metal sheets from integrally bonding in the patterned areas. However, embodiments are not limited thereto. Any type of method or material may be used as the release agent, as long as the release agent prevents the first and second metal sheets from integrally bonding in the patterned areas.

In some embodiments, the thickness of the first and second metal sheets 150, 120 is around 0.3 mm to around 6 mm, and the thickness of each of the first and second metal sheets 150, 120 is reduced by around 40% to around 60% during the roll-bonding process. However, embodiments are not limited in this regard. The thicknesses and amount of reduction in the thickness of the first and second metal sheets 150, 120 can be more or less depending upon the material, original thickness, the number of sheets, and processes used.

Figure 4A:
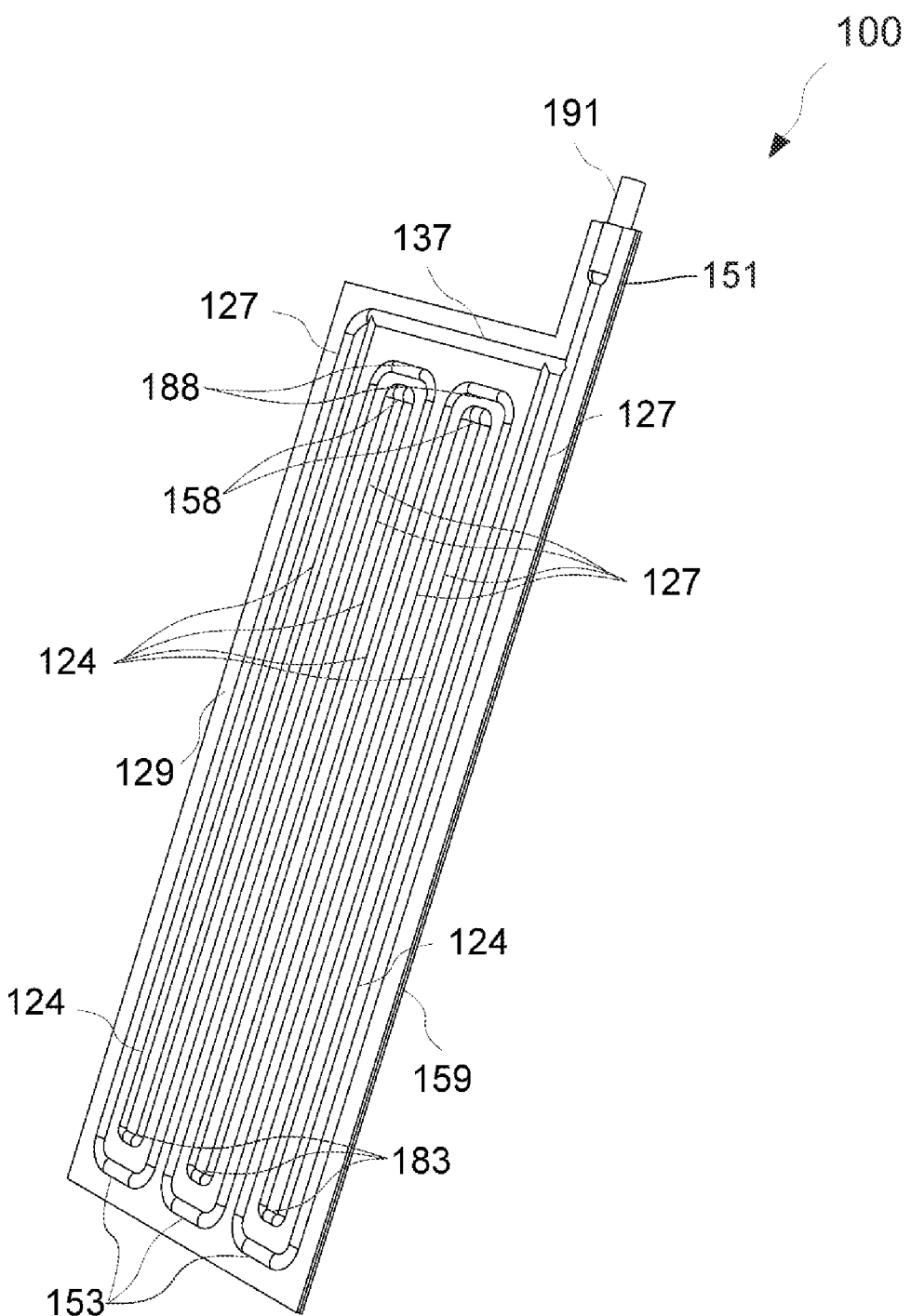
FIG. 4A is a schematic perspective view of the multi-channel thin heat exchanger following an operation of the manufacturing method of FIG. 3, according to embodiments of the disclosure.

FIG. 4A is a schematic perspective view of the multi-channel thin heat exchanger following operation 330 of the manufacturing method 300, according to embodiments of the disclosure. Referring to FIG. 4A, and with reference to FIGS. 1A to 3, in operation 330, a working pipe 191 is inserted and secured to the working section 151 extending from the first channel 127 adjacent an outer of the second inner surface 122. The first channel 127 extends through the working section 151 and the working pipe 191 is inserted in the first channel 127 and secured thereto. The working pipe 191 permits fluid communication with the first and second channels 127, 124.

Next, in operation 340, the interconnecting channel 137, the first channel 127, and the second channel 124 are inflated via a fluid (liquid or gas) having a pressure that results in even inflation throughout the multi-channel thin heat exchanger 100. In some embodiments, the fluid is atmospheric air having a suitable pressure for inflation. In other embodiments, the fluid may be nitrogen, oxygen, argon, hydrogen, carbon dioxide, or any desired gas or compatible mixtures thereof. In some embodiments, the working fluid is acetone. In other embodiments, the working fluid can include cyclopenta11e or n-hexane.

In some embodiments, the first and second metal sheets 150, 120 are inserted into a mold before inflating for even inflation throughout the multi-channel thin heat exchanger 100.

Figure 4B:
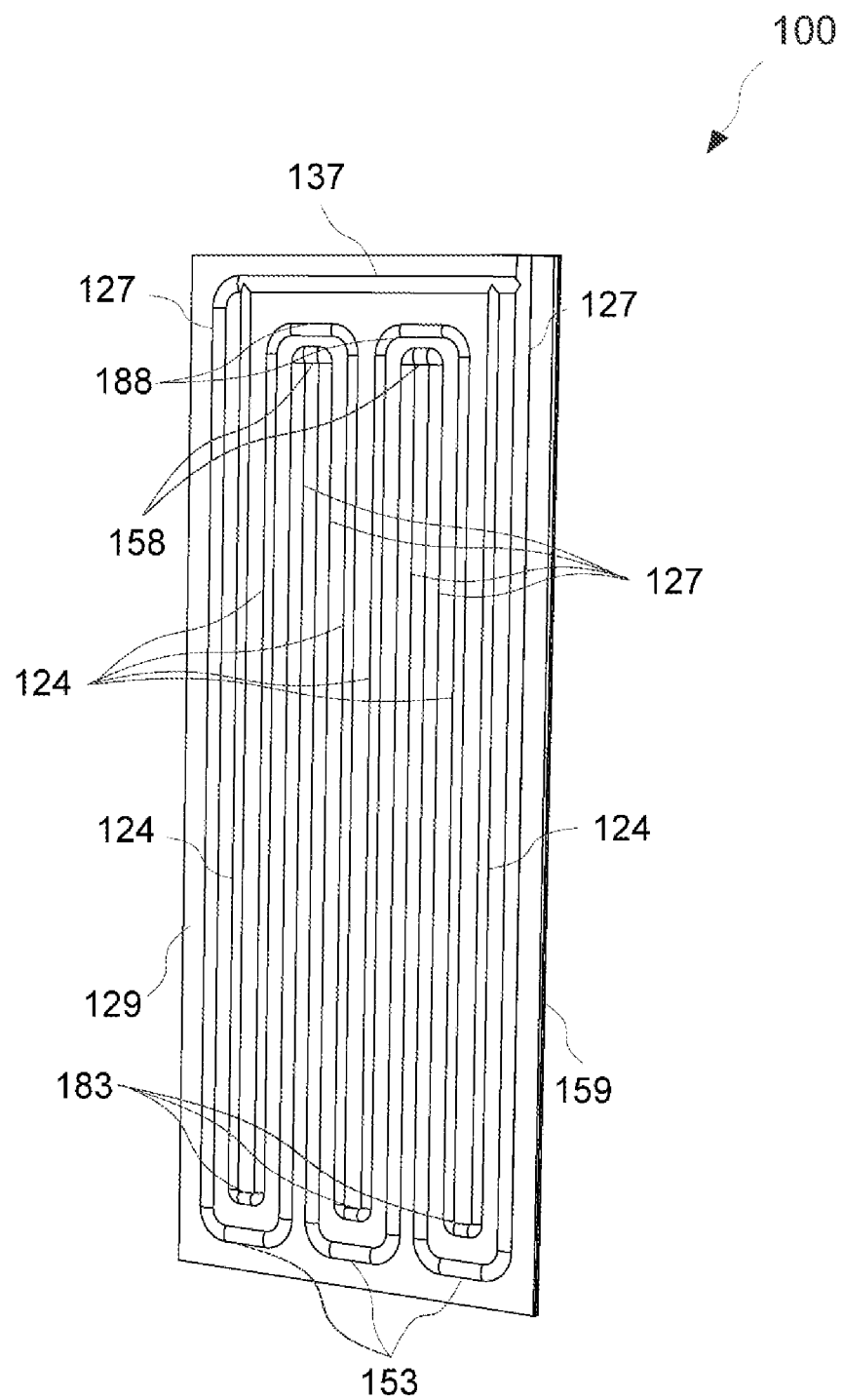
FIG. 4B is a perspective view of the multi-channel thin heat exchanger following an operation of the manufacturing method of FIG. 3, according to embodiments of the disclosure.

Next, in operation 350 a working fluid is introduced into the working pipe 191 and then air is vacuumed out. FIG. 4B is a perspective view of the multi-channel thin heat exchanger following operation 360 of the manufacturing method 300, according to embodiments of the disclosure. Referring to FIG. 4B, following operation 360, the working pipe 191 is closed, sealed, and trimmed. In some embodiments, the working pipe 191 is closed and sealed by flattening and then bonding. After cooling, the working section is cut.

In some embodiments, the first outer surface 159 is in thermal contact with a heat source (e.g., electronic device) and the multi-channel thin heat exchanger 100 dissipates heat generated by the heat source. In other embodiments, a heat source (e.g., electronic device) is in thermal contact with the second outer surface 129.

In some embodiments, the first metal sheet 150 and the second metal sheet 120 are made of aluminum, or an aluminum-alloy or the like, and formed by roll-bonding. However, other manufacturing processes may be used to form the first metal sheet 150 and the second metal sheet 120, such as stamping, depending upon material and manufacturing requirements. In other embodiments, the first metal sheet 150 and the second metal sheet 120 include copper, or a copper-alloy or the like, or other malleable metal heat conducting material having a relatively high thermal conductivity depending upon application and design requirements, without departing from the scope of the disclosure.

In some embodiments, bonding methods such as ultrasonic welding, diffusion welding, laser welding and the like, are used to bond (e.g., integrally) the first and second inner surfaces 152, 122 together at locations other than the locations including the interconnecting channel 137, the first channel 127, and the second channel 124. The first and second metal sheets are bounded such that a vacuum seal is obtained.

In some embodiments, an axial or circumferential wick structure having triangular, rectangular, trapezoidal, or reentrant cross-sectional geometries, or the like, may be formed on inner surfaces of the first channel 127, the second channel 124, the first bends 153, 158, and the second bends 183, 188. The wick structure is used to facilitate the flow of condensed fluid by capillary force back to the evaporation surface, keeping the evaporation surface wet for large heat fluxes.

In other embodiments, further heat treatment processes can be employed throughout the manufacturing method of the multi-channel thin heat exchanger 100. Additionally, one or more additional operations can be included in the process in order to incorporate additional features into the finished product. Also, the order of operations can be changed or new operations can be added, some operations can be deleted and substituted with other operations, or some operations can be performed simultaneously. For example, other operations can include operations of alloying, casting, scalping and pre-heating, operations such as annealing, and operations such as solution heat treatment or final annealing, stretching, leveling, slitting, edge trimming and aging, and the like.

In some embodiments, the multi-channel thin heat exchanger 100 includes the channels and bends on only one of the outer surfaces thereof. However, in other embodiments, the multi-channel thin heat exchanger includes channels on both outer surfaces.

Figure 5A:
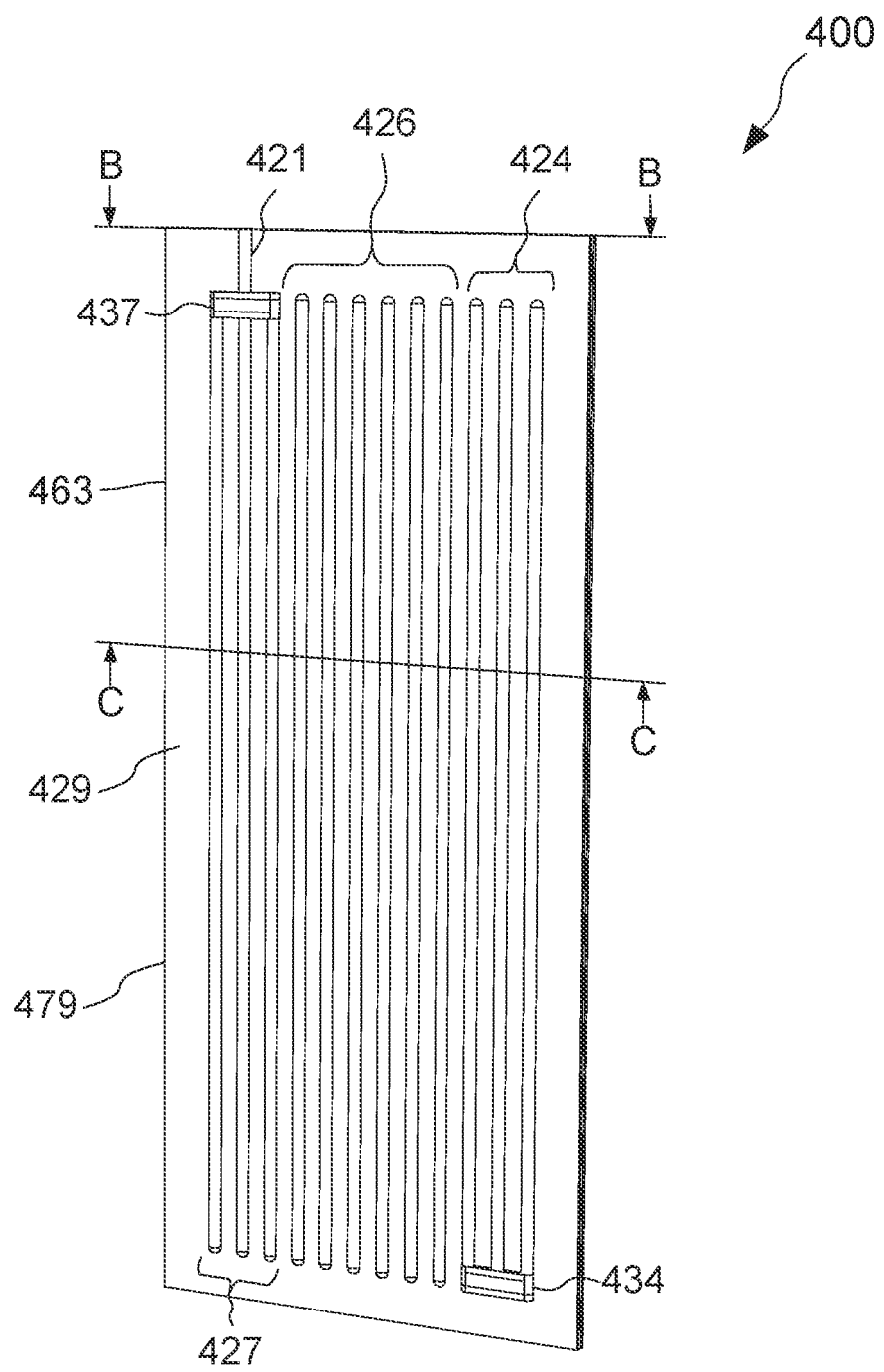
FIG. 5A is a schematic perspective view of a multichannel thin heat exchanger, according to embodiments of the disclosure.
Figure 5B:
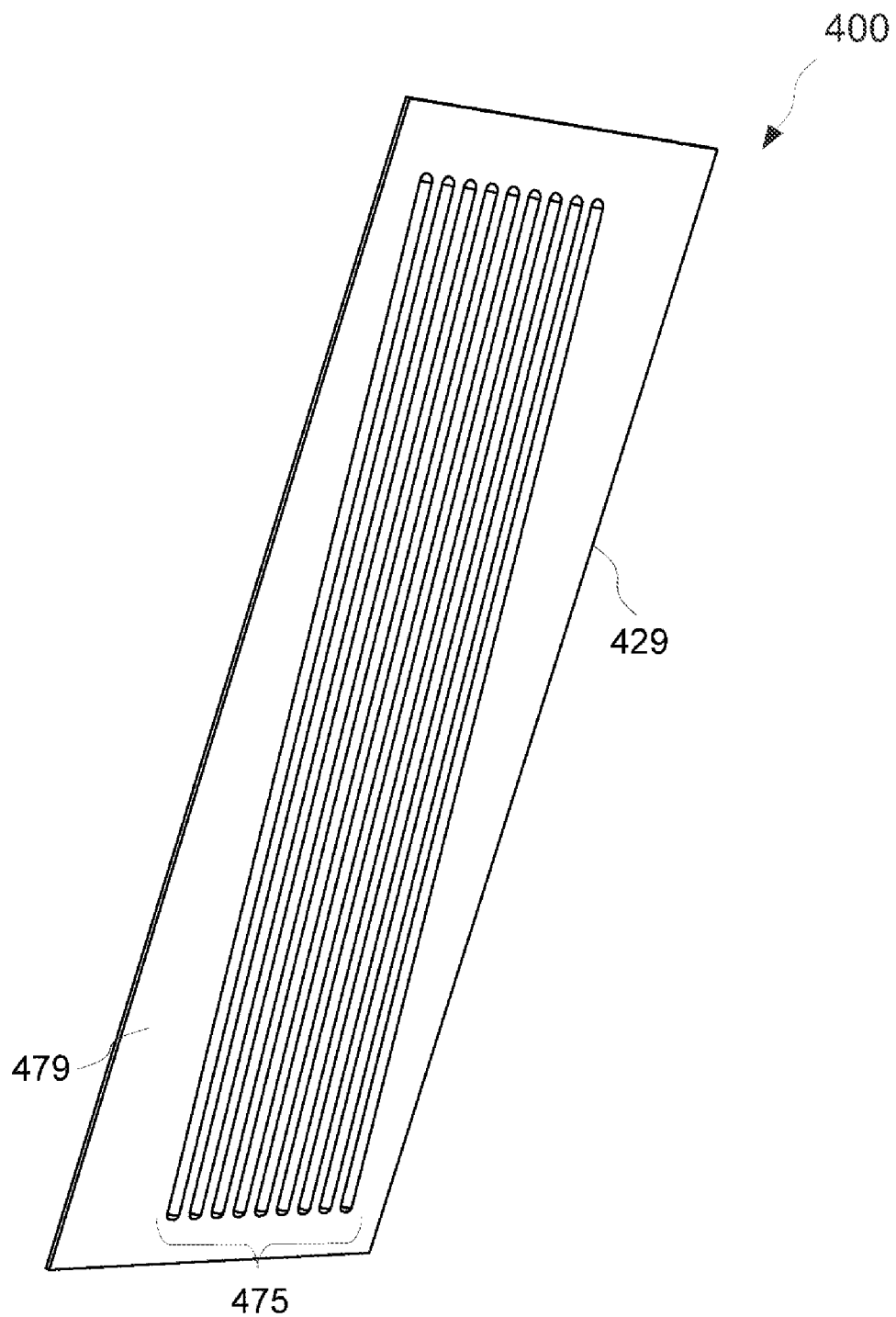
FIG. 5B is a schematic perspective view of the multi-channel thin heat exchanger of FIG. 5A, according to embodiments of the disclosure.

FIG. 5A is a schematic perspective view of a multichannel thin heat exchanger 400, according to embodiments of the disclosure. FIG. 5B is a schematic perspective view of the multi-channel thin heat exchanger 500 of FIG. 5A, according to embodiments of the disclosure. FIG. 5C is an exploded view of the multi-channel thin heat exchanger 500 of FIG. 5A, according to embodiments of the disclosure. Referring to FIGS. 5A to 5C, the multichannel thin heat exchanger 400 includes a first metal sheet 450, a second metal sheet 420, and a third metal sheet 470. The first metal sheet 450 includes first inner surfaces 452, 459 opposite each other, and a plurality of openings (or through-holes) 453, 458. The second metal sheet 420 includes a second inner surface 422 and a second outer surface 429. The second inner surface 422 includes a plurality of second channels 427 in fluid communication with the plurality openings 453, 458 and two interconnecting channels 434 on opposite ends of the plurality of second channels 427. As illustrated, the interconnecting channels 434 are longitudinally offset from each other and located adjacent longitudinally opposite edges 461 and 463 of the multichannel thin heat exchanger 400. Thus, the centrally located second channels 427 are not fluidly coupled to the interconnecting channels 434. The third metal sheet 470 includes a third inner surface 472 and a third outer surface 479. The third inner surface 472 includes a plurality of third channels 477 in fluid communication with the plurality of openings 453, 458. As illustrated, the openings 453, 458 are at or adjacent longitudinally opposite ends of the first metal sheet 450 and are located such that the second channels 427 and the third channels 477 are in fluid communication with the openings 453, 458 via the respective longitudinally opposite ends of the second channels 427 and the third channels 477. A number of openings 453 and a number of openings 458 each correspond to a number of second channels 427 and a number of third channels 477.

In some embodiments, the plurality of openings 453, 458 are in fluid communication with the plurality of second channels 427 and plurality of third channels 477. The plurality of second channels 427 are formed parallel to each other and to the outermost edges of the second inner surface 422 and the plurality of third channels 477 are formed inclined (angled) with reference to the outermost edges of the third inner surface 472. In some embodiments, the second metal sheet 420 includes 12 second channels 427, two interconnecting channels 434, nine third channels 477, and nine openings 453, 458 each. However, embodiments are not limited in this regard. The number of second channels 427, the interconnecting channels 434, the third channels 477, and the openings 483, 458 are varied depending upon the application and design requirements, without departing from the scope of the disclosure, and provided the second channels 427, the third channels 477, and the openings 453, 458 are in fluid communication with one another.

The second channels 427 are formed as recesses in the second inner surface 422. Similarly, the third channels 477 are formed as recesses in the third inner surface 472. Alternatively, the second channels 427 are formed as corresponding protrusions in the second outer surface 429 and the third channels 477 are formed as a corresponding protrusions on the third outer surface 479.

Figure 6A:
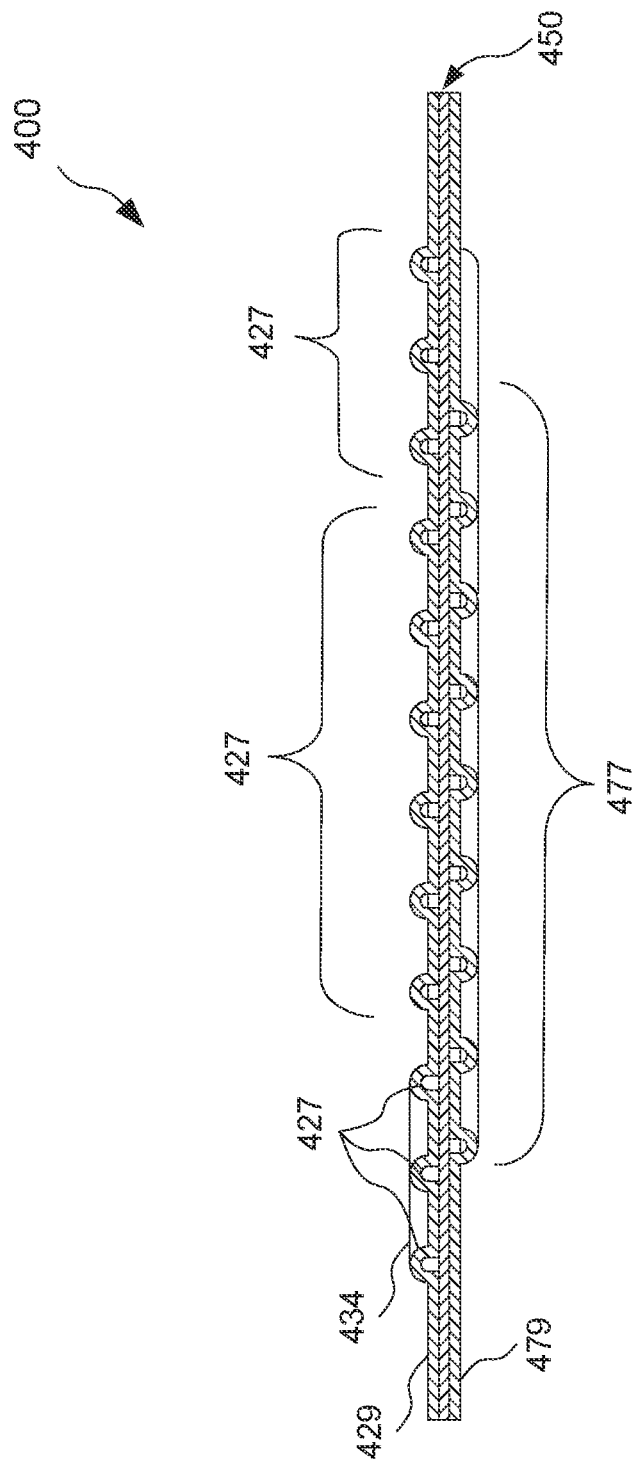
FIG. 6A is a schematic cross-sectional view of the multi-channel thin heat exchanger of FIG. 5A along line C-C, according to embodiments of the disclosure.
Figure 6B:
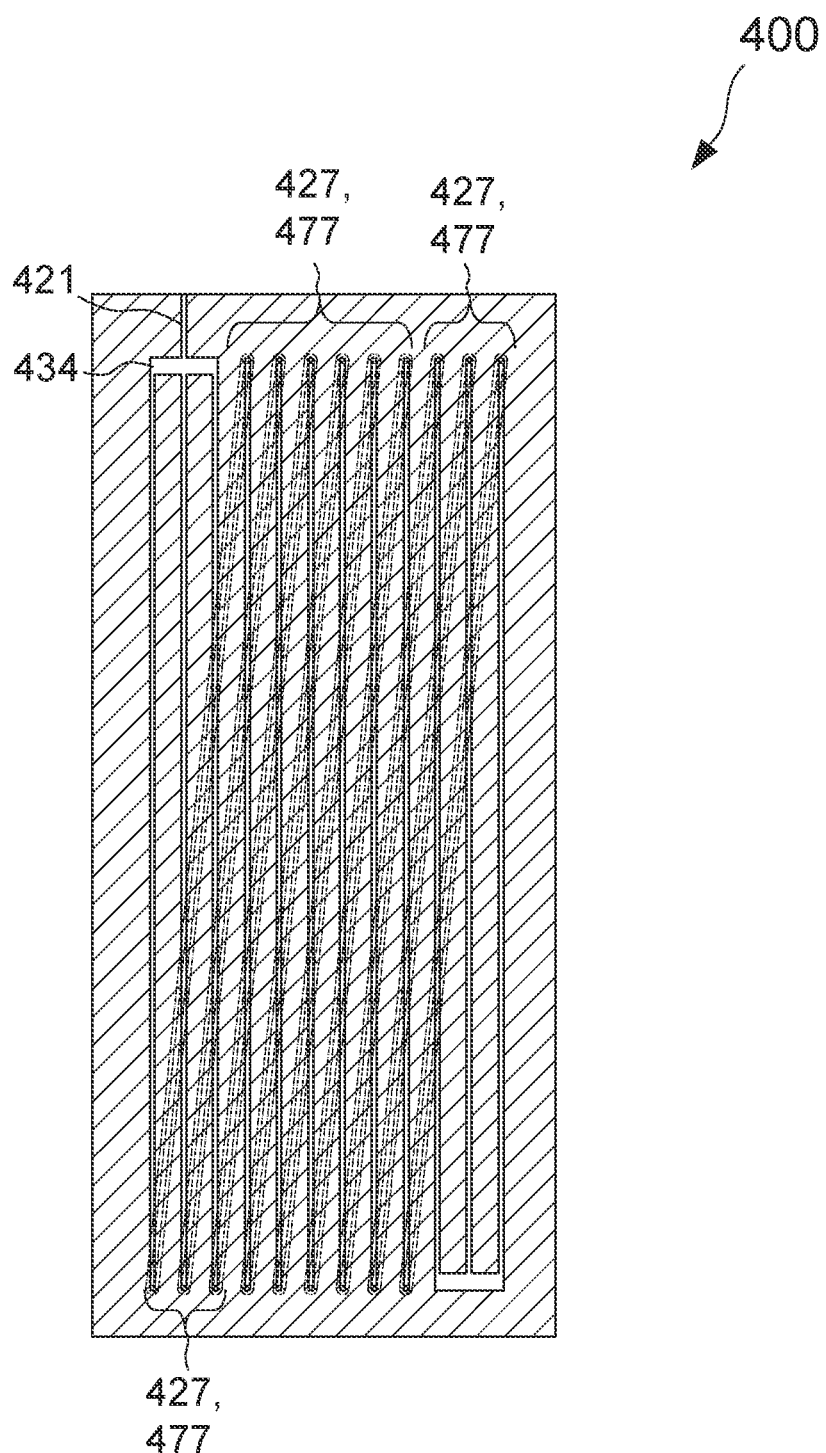
FIG. 6B is a schematic cross-sectional view of the multi-channel thin heat exchanger of FIG. 5A along line B-B, according to embodiments of the disclosure.

FIG. 6A is a schematic cross-sectional view of the multi-channel thin heat exchanger 400 of FIG. 5A along line C-C, according to embodiments of the disclosure. FIG. 6B is a schematic cross-sectional view of the multi-channel thin heat exchanger 400 of FIG. 5A along line B-B, according to embodiments of the disclosure. Referring to FIGS. 6A to 6B, with reference to FIGS. 5A to 5C, the plurality of second channels 427 are fluidly coupled to the plurality of third channels 477 via the plurality of openings 453, 458. The interconnecting channels 434 result in the plurality of first channels 127 being formed in three independent channel groups 424, 426, and 428, with the channel groups 424 and 428 fluidly communicating with the interconnecting channels 434 and the channel group 426 disposed between the channel groups 424 and 428. The channel groups 424 and 428 are disposed adjacent the longitudinally outer edges of the 461 and 463 of the multi-channel thin heat exchanger 400. Such an arrangement of the channels allows for greater heat dissipation efficiency of the multi-channel thin heat exchanger 400. Each second channel 427 and each third channel 477 is a separate structure formed in the respective second metal sheet 420 and a third metal sheet 470, and each extends in a generally longitudinal direction along the respective the second inner surface 422 and the third inner surface 472.

In some embodiments, the height and width of the plurality of second channels 427 and the plurality of third channels 477 are the same, and the width of the plurality of openings 453, 458 is the same as the width of the plurality of second channels 427 and the plurality of third channels 477. Generally, the number of the plurality of second channels 427, the plurality of third channels 477, and the plurality of openings 453, 458 is the same for even flow. However, embodiments are not limited in this regard, and the number of the plurality of second channels 427, the plurality of third channels 477, and the plurality of openings 453, 458, the relative arrangement of the channels and openings, and the height and width of the channels and openings may be varied depending upon application and design requirements, without departing from the scope of the disclosure.

In some embodiments, the first inner surface 452, 459 are bonded to the second and third inner surfaces 422, 472, respectively, at locations other than the locations including the interconnecting channel 434, the plurality of second channels 427, the plurality of third channels 477, and the plurality of openings 453, 458. The multi-channel thin heat exchanger 400 can be manufactured using the method 300 illustrated in FIG. 3, and a detailed description is omitted for the sake of conciseness.

The operations in the method 300 are used for manufacturing of the multi-channel thin heat exchanger 400 with adjustments to allow for formation of the plurality of openings 453, 458 and third metal sheet 470. In some embodiments, the first metal sheet 450, the second metal sheet 420, and the third metal sheet 470 are provided in operation 310. The first metal sheet 450 includes the plurality of openings 453, 458. Prior to the operation 320, the first metal sheet 450 is positioned between the second metal sheet 420 and the third metal sheet 470 so that the first metal sheet 450, the second metal sheet 420, and the third metal sheet 470 are roll-bonded in operation 320.

Figure 7A:
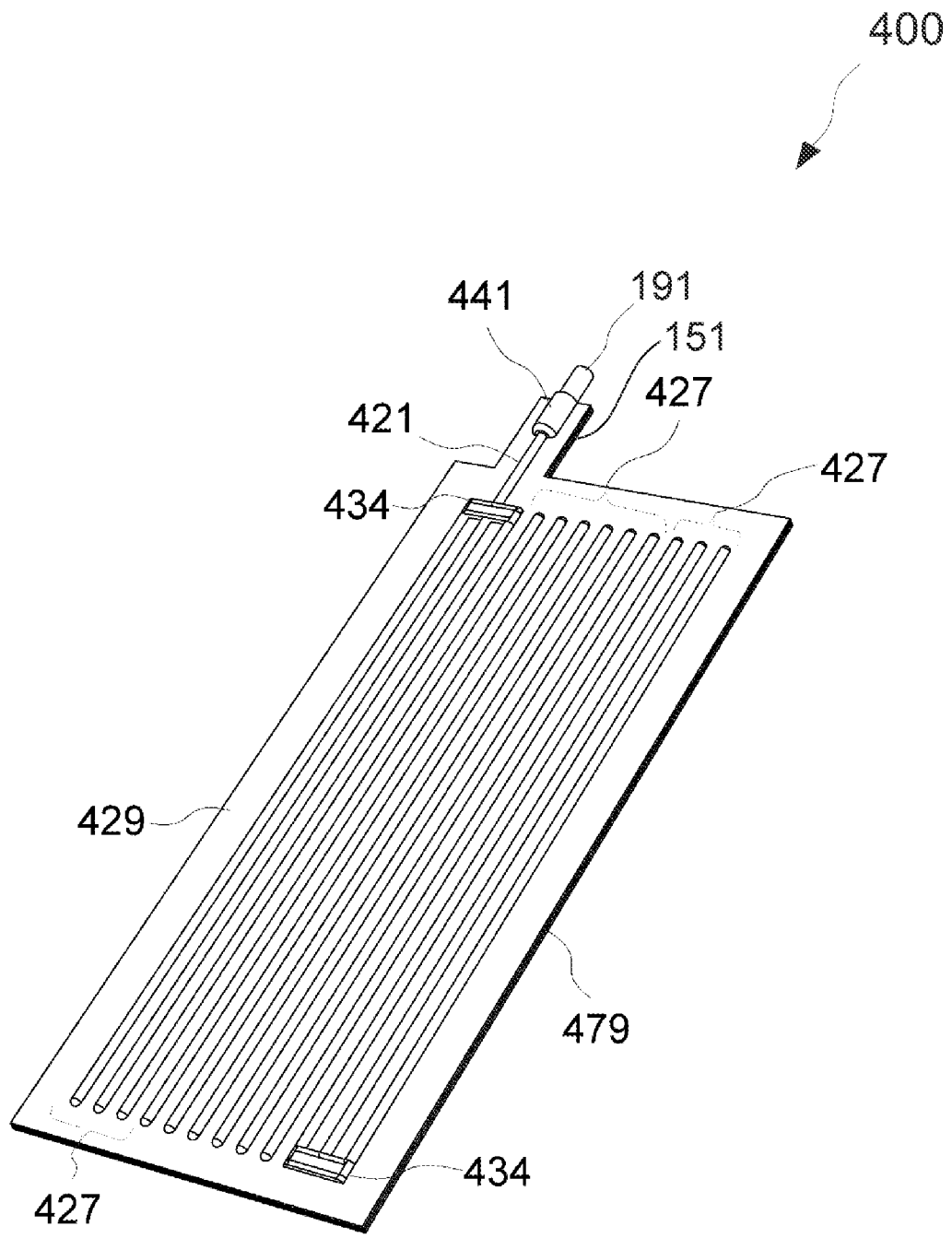
FIG. 7A is a perspective view of the multichannel thin heat exchanger of FIG. 5A following an operation of the manufacturing method of FIG. 3, according to embodiments of the disclosure.
Figure 7B:
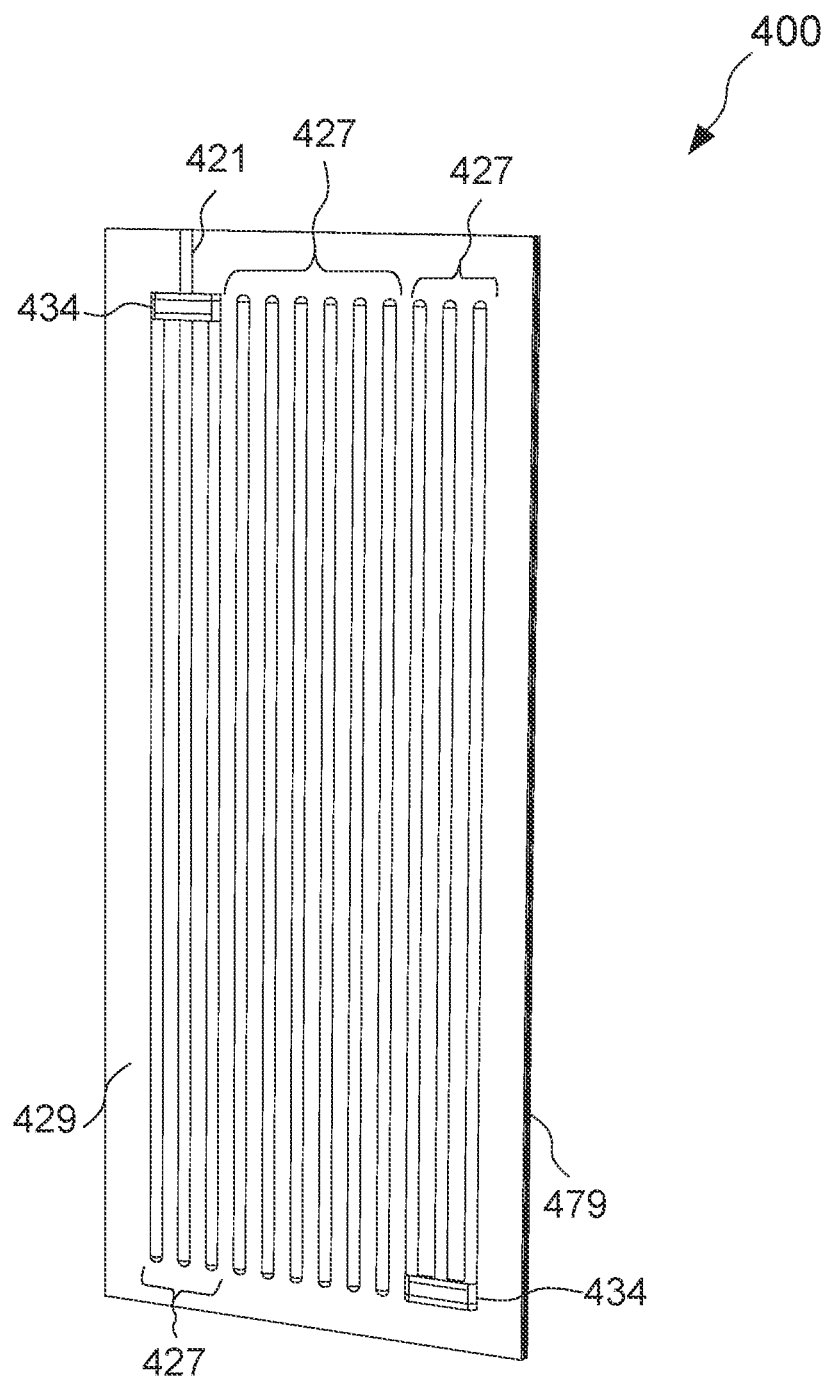
FIG. 7B is a perspective view of the multi-channel thin heat exchanger of FIG. 5A following an operation of the manufacturing method of FIG. 3, according to embodiments of the disclosure.

FIG. 7A is a perspective view of the multichannel thin heat exchanger 400 of FIG. 5A following operation 330 of the manufacturing method 300, according to embodiments of the disclosure. FIG. 7B is a perspective view of the multi-channel thin heat exchanger 400 of FIG. 5A following operation 360 of the manufacturing method 300, according to embodiments of the disclosure.

Figure 8:
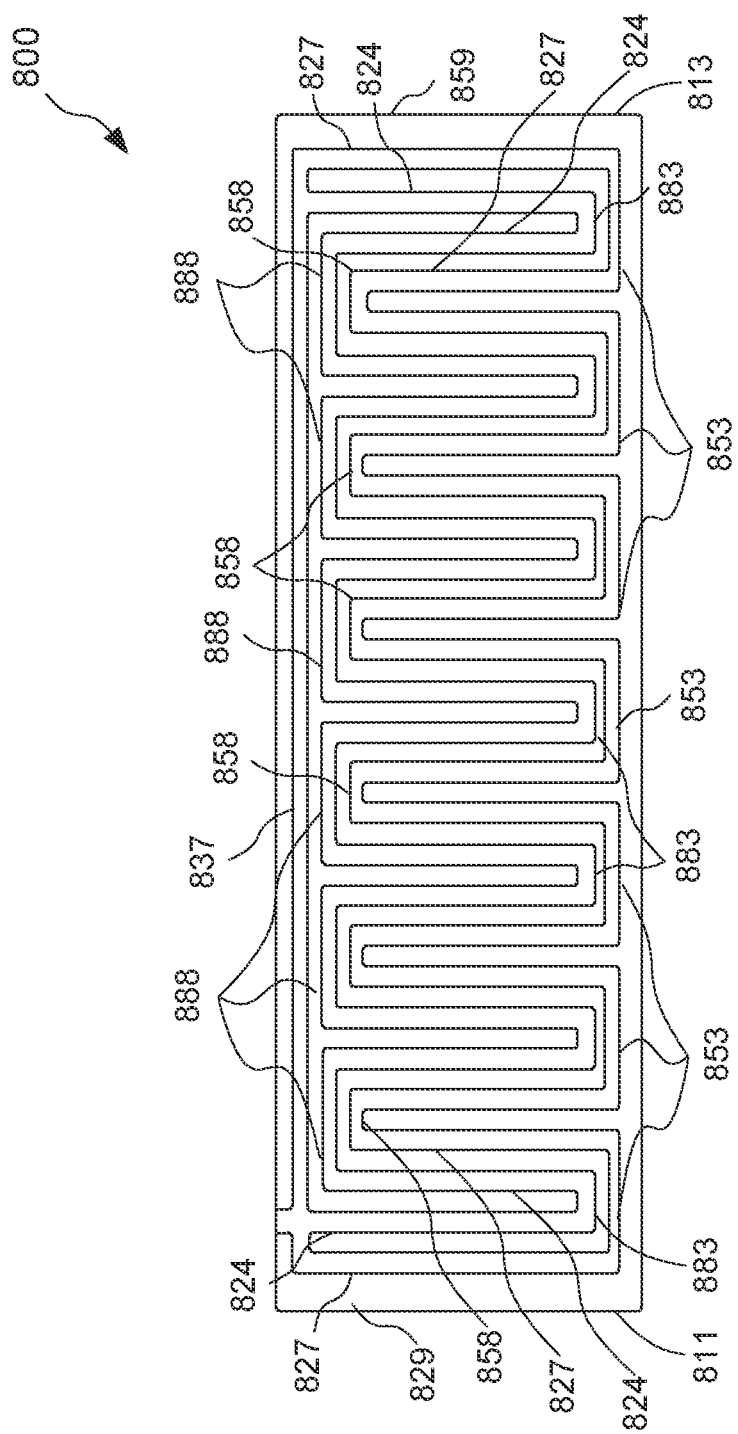
FIG. 8 is a schematic perspective view of a multichannel thin heat exchanger, according to embodiments of the disclosure.

FIG. 8 is a schematic perspective view of a multichannel thin heat exchanger 800, according to embodiments of the disclosure. Referring to FIG. 8, the multi-channel thin heat exchanger 800 includes a first metal sheet and a second metal sheet. The first metal sheet includes a first inner surface and a first outer surface 859. The second metal sheet includes a second inner surface and a second outer surface 829. The second inner surface includes an interconnecting channel 837, a first channel 827 having a plurality of first bends 853, 858, and a second channel 824 having a plurality of second bends 883, 888. In some embodiments, each of the first channel 827, second channel 824, and interconnecting channel 837 have a same unit volume.

In some embodiments, the interconnecting channel 837 is in fluid communication with the first channel 827 and the second channel 824 on opposite ends of the second inner surface. The first channel 827 and the second channel 824 form an interleaved structure in which the first channel 827 is formed adjacent the outermost edges 811 and 813 of the multichannel thin heat exchanger 800 and the second channel 824 is within the first channel 827.

In some embodiments, the number of bends 853 of the first channel 827 and corresponding number of bends 883 of the second channel 824 can be increased or decreased to increase or decrease the length of the first channel 827 and the second channel 824 as required by application and design requirements, without departing from the scope of the disclosure.

In some embodiments, the multi-channel thin heat exchanger 800 includes the channels and bends on only one of the outer surfaces thereof. However, in other embodiments, the multi-channel thin heat exchanger includes channels on both outer surfaces.

Figure 9:
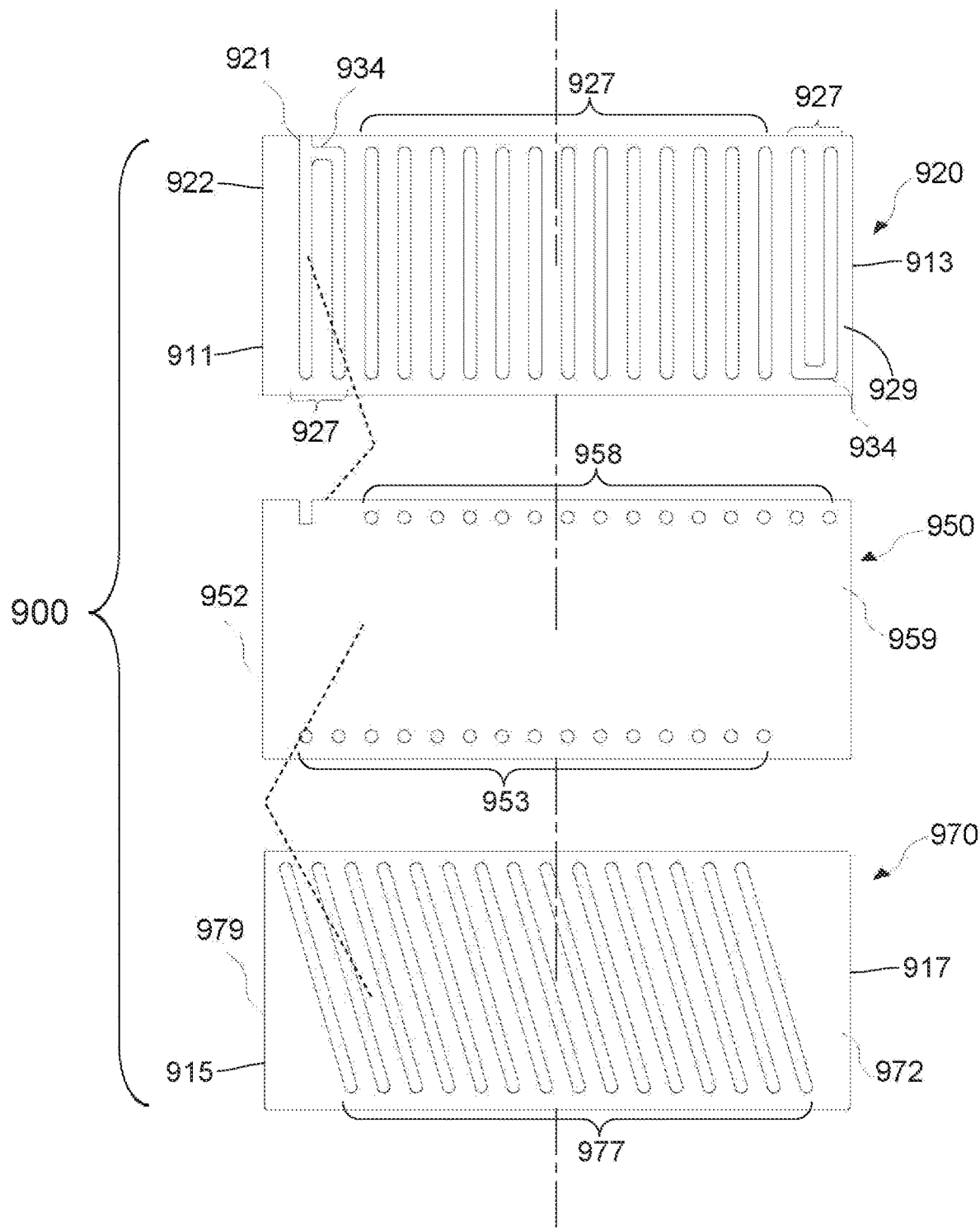
FIG. 9 is an exploded view of a multi-channel thin heat exchanger, according to embodiments of the disclosure.

FIG. 9 is an exploded view of a multi-channel thin heat exchanger 900, according to embodiments of the disclosure. Referring to FIG. 9, the multi-channel thin heat exchanger 900 includes a first metal sheet 950 interposed between a second metal sheet 920 and a third metal sheet 970. The first metal sheet 950 includes inner surfaces 952, 959, and a plurality of openings (through-holes) 953, 958. The second metal sheet 920 includes a second inner surface 922 and a second outer surface 929. The second inner surface 922 includes a plurality of second channels 927 fluidly communicating with the plurality of openings 953, 958 and two interconnecting channels 934 on diagonal opposite ends each other. Each interconnecting channel 934 is in fluid communication with two or more second channels 927 and the plurality of openings 953, 958. The third metal sheet 970 includes a third inner surface 972 and a third outer surface 979. The third inner surface 972 includes a plurality of third channels 977 arranged parallel to each other and fluidly communicating with the plurality of openings 953, 958. As illustrated, the ends of the second channels 927 and the third channels 977 fluidly communicate with the openings 953 and 958.

In some embodiments, the plurality of openings 953, 958 are in fluid communication with the ends of the plurality of second channels 927 and ends of the plurality of third channels 977 each. The plurality of second channels 927 are formed parallel to the outer edges 911 and 913 of the first second sheet 920 and the plurality of third channels 977 are formed inclined (angled) to the outer edges 915 and 917 third sheet 970.

In some embodiments, the number of second channels 927, the interconnecting channels 934, the third channels 977, and the openings 953, 958 can be increased or decreased depending on the application and design requirements, without departing from the scope of the disclosure, provided second channels 927, the third channels 977, and the openings 953, 958 are in fluid communication with one another.

In some embodiments, a heat source (e.g., electronic device) is positioned on any desired location on the second outer surface 929 and/or the third outer surface 979 of the multi-channel thin heat exchanger.

In some embodiments, the multi-channel thin heat exchanger is quadrilateral shaped. However, the shape is not limited to any particular shape and the multi-channel thin heat exchanger can have any shape as required by application and design, without departing from the scope of the disclosure.

The disclosed embodiments are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless: specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A heat dissipation device, comprising:
 a first metal sheet including a plurality of through-holes;
 a second metal sheet including a first plurality of channels, a first interconnecting channel, and a second interconnecting channel that are formed within the second metal sheet, the first interconnecting channel is directly connected to ends of two or more of channels of a first set of channels of the first plurality of channels and the second interconnecting channel is directly connected to ends of two or more channels of a second set of channels of the first plurality of channels; and
 a third metal sheet including a second plurality of channels, wherein
 the first metal sheet, the second metal sheet, and the third metal sheet are coupled to each other, and the first metal sheet is disposed between the second metal sheet and the third metal sheet, and
 the first plurality of channels and the second plurality of channels are in fluid communication with each other through the plurality of through-holes.

2. The heat dissipation device of claim 1, wherein a first set of through-holes of the plurality of through-holes are disposed adjacent a first edge of the first metal sheet, and a second set of through-holes of the plurality of through-holes are disposed adjacent a second edge of the first metal sheet opposite the first edge.

3. The heat dissipation device of claim 2, wherein a number of through-holes in the first set and a number of through-holes in the second set, each correspond to a number of the first plurality of channels and a number of the second plurality of channels.

4. The heat dissipation device of claim 1, wherein
 the first set of channels of the first plurality of channels are disposed adjacent a first longitudinal edge of the second metal sheet,
 the second set of channels of the first plurality of channels are disposed adjacent a second longitudinal edge of the second metal sheet opposite the first longitudinal edge, and
 a third set of channels of the first plurality of channels is disposed between the first set of channels and the second set of channels.

5. The heat dissipation device of claim 4, wherein the first plurality of channels are parallel to each other and to edges of the second metal sheet.

6. The heat dissipation device of claim 1, wherein the second plurality of channels are parallel to each other and inclined with respect to edges of the second metal sheet.

* * * * *